(12) United States Patent
Shin et al.

(10) Patent No.: US 10,607,683 B2
(45) Date of Patent: Mar. 31, 2020

(54) SEMICONDUCTOR MEMORY DEVICE CAPABLE OF PERFORMING A HAMMER REFRESH OPERATION WHILE PERFORMING A NORMAL REFRESH OPERATION AND MEMORY SYSTEM HAVING THE SAME

(71) Applicant: SAMSUNG ELECTRONICS CO., LTD., Suwon-si (KR)

(72) Inventors: Hoon Shin, Hwaseong-si (KR); Do Yeon Kim, Hwaseong-si (KR); Ho Young Song, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/059,791

(22) Filed: Aug. 9, 2018

(65) Prior Publication Data
US 2019/0333573 A1    Oct. 31, 2019

(30) Foreign Application Priority Data
Apr. 25, 2018    (KR) .......................... 10-2018-0047741

(51) Int. Cl.
*G11C 11/406*    (2006.01)
*G11C 11/4091*    (2006.01)

(52) U.S. Cl.
CPC .... *G11C 11/40618* (2013.01); *G11C 11/4091* (2013.01); *G11C 11/40622* (2013.01)

(58) Field of Classification Search
CPC ....................... G11C 11/40618; G11C 11/4091
See application file for complete search history.

(56) References Cited

U.S. PATENT DOCUMENTS

| 9,032,141 | B2 | 5/2015 | Bains et al. |
| 9,384,821 | B2 | 7/2016 | Bains et al. |
| 9,478,316 | B1 | 10/2016 | Ryu |
| 9,484,079 | B2 | 11/2016 | Lee |
| 9,653,139 | B1 * | 5/2017 | Park .................. G11C 11/40615 |
| 9,741,422 | B1 * | 8/2017 | Park .................. G11C 11/40618 |
| 9,761,298 | B2 | 9/2017 | Halbert et al. |
| 9,818,469 | B1 * | 11/2017 | Kim ...................... G06F 3/0619 |
| 2014/0059287 | A1 * | 2/2014 | Bains ................ G11C 11/40615 |
| | | | 711/106 |
| 2017/0011792 | A1 | 1/2017 | Oh et al. |
| 2017/0117030 | A1 | 4/2017 | Fisch et al. |

(Continued)

FOREIGN PATENT DOCUMENTS

KR    101725636 B1    4/2017

*Primary Examiner* — Mushfique Siddique
(74) *Attorney, Agent, or Firm* — Sughrue Mion, PLLC

(57) ABSTRACT

A semiconductor memory device and a memory system having the same are provided. The semiconductor memory device includes a memory cell array including plural memory cell array blocks, and a refresh controller configured to control the memory cell array blocks to perform a normal refresh operation and a hammer refresh operation. The refresh controller controls one or more third memory cell array blocks excluding a first memory cell array block and one or more second memory cell array blocks adjacent to the first memory cell array block to perform the hammer refresh operation while the normal refresh operation is performed on the first memory cell array block among the memory cell array blocks.

20 Claims, 9 Drawing Sheets

(56) References Cited

U.S. PATENT DOCUMENTS

| | | | |
|---|---|---|---|
| 2017/0186481 A1* | 6/2017 | Oh ................... | G11C 11/40615 |
| 2017/0213586 A1* | 7/2017 | Kang .................... | G06F 3/0619 |
| 2017/0287547 A1* | 10/2017 | Ito ........................ | G11C 29/783 |
| 2018/0061476 A1* | 3/2018 | Kim ................. | G11C 11/40622 |
| 2018/0158507 A1* | 6/2018 | Bang ................ | G11C 11/40603 |
| 2019/0087127 A1* | 3/2019 | Kim ..................... | G06F 11/076 |

* cited by examiner

FIG. 7

| (a) | (b) | (c) | (d) |
|---|---|---|---|
| BLK1 | BLK1 | BLK1 | BLK1 |
| BLK2 | BLK2 | BLK2 | BLK2 |
| BLK3 | BLK3 | BLK3 | BLK3 |
| BLK4 | BLK4 | BLK4 | BLK4 |
| BLK5 | BLK5 | BLK5 | BLK5 |
| BLK6 | BLK6 | BLK6 | BLK6 |
| BLK7 | BLK7 | BLK7 | BLK7 |
| BLK8 | BLK8 | BLK8 | BLK8 |
| BLK9 | BLK9 | BLK9 | BLK9 |
| BLK10 | BLK10 | BLK10 | BLK10 |
| BLK11 | BLK11 | BLK11 | BLK11 |
| BLK12 | BLK12 | BLK12 | BLK12 |
| BLK13 | BLK13 | BLK13 | BLK13 |
| BLK14 | BLK14 | BLK14 | BLK14 |
| BLK15 | BLK15 | BLK15 | BLK15 |
| BLK16 | BLK16 | BLK16 | BLK16 |
| BLK17 | BLK17 | BLK17 | BLK17 |
| BLK18 | BLK18 | BLK18 | BLK18 |
| BLK19 | BLK19 | BLK19 | BLK19 |
| BLK20 | BLK20 | BLK20 | BLK20 |
| BLK21 | BLK21 | BLK21 | BLK21 |
| BLK22 | BLK22 | BLK22 | BLK22 |
| BLK23 | BLK23 | BLK23 | BLK23 |
| BLK24 | BLK24 | BLK24 | BLK24 |
| BLK25 | BLK25 | BLK25 | BLK25 |
| BLK26 | BLK26 | BLK26 | BLK26 |
| BLK27 | BLK27 | BLK27 | BLK27 |
| BLK28 | BLK28 | BLK28 | BLK28 |
| BLK29 | BLK29 | BLK29 | BLK29 |
| BLK30 | BLK30 | BLK30 | BLK30 |
| BLK31 | BLK31 | BLK31 | BLK31 |
| BLK32 | BLK32 | BLK32 | BLK32 |

FIG. 8

| (a) | (b) | (c) | (d) |
|---|---|---|---|
| BLK1 | BLK1 | BLK1 | BLK1 |
| BLK2 | BLK2 | BLK2 | BLK2 |
| BLK3 | BLK3 | BLK3 | BLK3 |
| BLK4 | BLK4 | BLK4 | BLK4 |
| BLK5 | BLK5 | BLK5 | BLK5 |
| BLK6 | BLK6 | BLK6 | BLK6 |
| BLK7 | BLK7 | BLK7 | BLK7 |
| BLK8 | BLK8 | BLK8 | BLK8 |
| BLK9 | BLK9 | BLK9 | BLK9 |
| BLK10 | BLK10 | BLK10 | BLK10 |
| BLK11 | BLK11 | BLK11 | BLK11 |
| BLK12 | BLK12 | BLK12 | BLK12 |
| BLK13 | BLK13 | BLK13 | BLK13 |
| BLK14 | BLK14 | BLK14 | BLK14 |
| BLK15 | BLK15 | BLK15 | BLK15 |
| BLK16 | BLK16 | BLK16 | BLK16 |
| BLK17 | BLK17 | BLK17 | BLK17 |
| BLK18 | BLK18 | BLK18 | BLK18 |
| BLK19 | BLK19 | BLK19 | BLK19 |
| BLK20 | BLK20 | BLK20 | BLK20 |
| BLK21 | BLK21 | BLK21 | BLK21 |
| BLK22 | BLK22 | BLK22 | BLK22 |
| BLK23 | BLK23 | BLK23 | BLK23 |
| BLK24 | BLK24 | BLK24 | BLK24 |
| BLK25 | BLK25 | BLK25 | BLK25 |
| BLK26 | BLK26 | BLK26 | BLK26 |
| BLK27 | BLK27 | BLK27 | BLK27 |
| BLK28 | BLK28 | BLK28 | BLK28 |
| BLK29 | BLK29 | BLK29 | BLK29 |
| BLK30 | BLK30 | BLK30 | BLK30 |
| BLK31 | BLK31 | BLK31 | BLK31 |
| BLK32 | BLK32 | BLK32 | BLK32 |

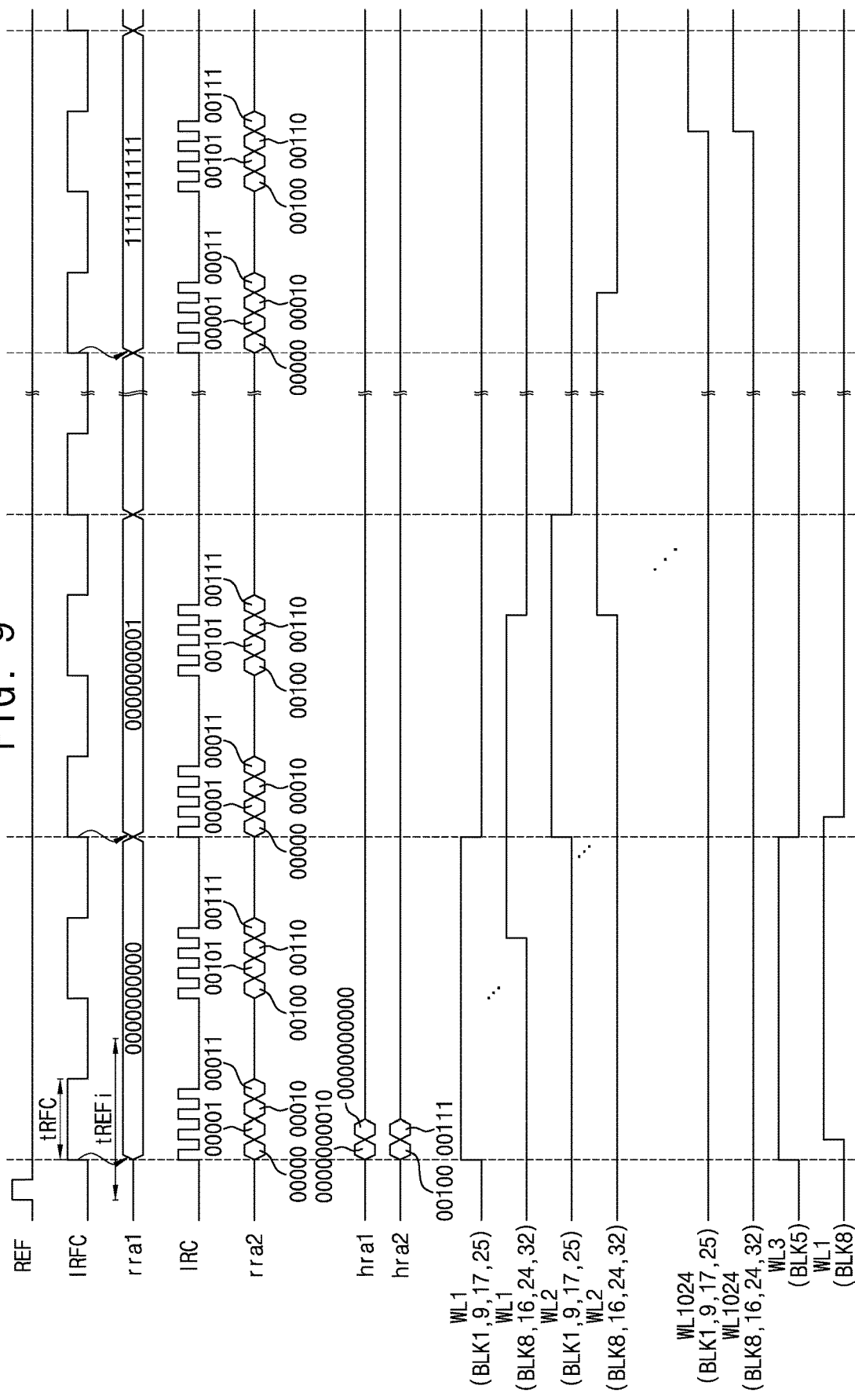

SEMICONDUCTOR MEMORY DEVICE CAPABLE OF PERFORMING A HAMMER REFRESH OPERATION WHILE PERFORMING A NORMAL REFRESH OPERATION AND MEMORY SYSTEM HAVING THE SAME

CROSS-REFERENCE TO RELATED APPLICATION

This U.S. non-provisional patent application claims priority under 35 U.S.C. § 119 from Korean Patent Application No. 10-2018-0047741, filed on Apr. 25, 2018, in the Korean Intellectual Property Office (KIPO), the disclosure of which is incorporated by reference herein in its entirety.

BACKGROUND

1. Field

Devices and systems consistent with the present disclosure relate to a semiconductor memory device and a memory system having the same.

2. Discussion of Related Art

Semiconductor memory devices are generally classified into a volatile semiconductor memory device and a non-volatile semiconductor memory device. The volatile semiconductor memory device (for example, a dynamic random access memory (DRAM) device, etc.) may maintain stored data during power is supplied and lose the stored data when the power is not supplied, but the non-volatile semiconductor memory device may maintain the stored data even when power is not supplied.

The DRAM may perform a normal refresh operation on the plurality of dynamic memory cells every refresh period in order to maintain data stored in the plurality of dynamic memory cells even during power is supplied. Further, a hammer refresh operation may be performed.

SUMMARY

It is an aspect to provide a semiconductor memory device capable of performing a hammer refresh operation while performing a normal refresh operation, and a memory system having the same.

According to an aspect of example embodiments, there is provided a semiconductor memory device including a memory cell array including a plurality of memory cell array blocks; and a refresh controller configured to control the plurality of memory cell array blocks to perform a normal refresh operation and a hammer refresh operation, wherein the refresh controller controls at least one third memory cell array block excluding a first memory cell array block and at least one second memory cell array block adjacent to the first memory cell array block to perform the hammer refresh operation while the normal refresh operation is performed on the first memory cell array block among the plurality of memory cell array blocks.

According to another aspect of example embodiments, there is provided a semiconductor memory device including a memory cell array comprising a plurality of memory cell array blocks, each of which comprises a plurality of dynamic memory cells connected between a plurality of word lines and a plurality of bit lines and in which a plurality of main word lines are arranged, and a plurality of sense amplification blocks, arranged between the plurality of memory cell array blocks and in which a plurality of word line selection signal lines are arranged; a refresh row address generator configured to generate a first refresh row address and a second refresh row address in response to a refresh command; a row address generator configured to select a row address in response to an active command, and select the first refresh row address and the second refresh row address to generate a row address signal in response to the refresh command; a hammer row address generator configured to generate a first hammer row address and a second hammer row address as a hammer row address signal when the second hammer row address is compared with each of the second refresh row address and at least one adjacent second refresh row address that is adjacent to the second refresh row address, and do not match; and a row decoder configured to decode the row address signal and the hammer row address signal to generate a plurality of main word line selection signals for selecting the plurality of main word lines of each of the plurality of memory cell array blocks and a plurality of word line selection signals for selecting the plurality of word line selection signal lines of each of the plurality of sense amplification blocks, wherein a hammer refresh operation is performed on at least one third memory cell array block excluding a first threshold number of first memory cell array blocks among the plurality of memory cell array blocks and a second threshold number of second memory cell array blocks adjacent to the first threshold number of first memory cell array blocks while a normal refresh operation is performed on the first threshold number of first memory cell array blocks.

According to another aspect of example embodiments, there is provided a memory system a including a control unit configured to transmit a command and address, and to input and output data; and a semiconductor memory device configured to receive the command and address, and to input and output the data, wherein the semiconductor memory device comprises a memory cell array comprising a plurality of memory cell array blocks; and a refresh controller configured to control the plurality of memory cell array blocks to perform a normal refresh operation and a hammer refresh operation, wherein the refresh controller controls at least one third memory cell array block excluding a first memory cell array block and a second memory cell array block adjacent to the first memory cell array block to perform the hammer refresh operation while the normal refresh operation is performed on the first memory cell array block among the plurality of memory cell array blocks.

BRIEF DESCRIPTION OF THE DRAWINGS

The above and/or other aspects will become more apparent to those of ordinary skill in the art by describing example embodiments thereof in detail with reference to the accompanying drawings, in which:

FIGS. 7 and 8 are diagrams for describing memory cell array blocks capable of performing a hammer refresh operation when a normal refresh operation is performed on each of memory cell array blocks of a memory cell array according to an example embodiment of the inventive concept;

FIG. 9 is an operational timing diagram for describing an operation of a semiconductor memory device according to an example embodiment of the inventive concept.

DETAILED DESCRIPTION

A DRAM may store data in a plurality of dynamic memory cells, and each of the plurality of dynamic memory cells may include one transistor and one capacitor. The DRAM should perform a normal refresh operation on the plurality of dynamic memory cells every refresh period in order to maintain data stored in the plurality of dynamic memory cells even during power is supplied. Further, since data stored in dynamic memory cells adjacent to frequently accessed dynamic memory cells may be lost faster than data stored in dynamic memory cells adjacent to normally accessed dynamic memory cells, the DRAM may additionally perform a hammer refresh operation on the dynamic memory cells adjacent to the frequently accessed dynamic memory cells.

Hereinafter, a semiconductor memory device and a memory system having the same according to example embodiments of the inventive concept will be described with reference to the accompanying drawings. In this specification, the phrase "at least one of A and B" includes "only A", "only B", and "both A and B".

Figure 1:
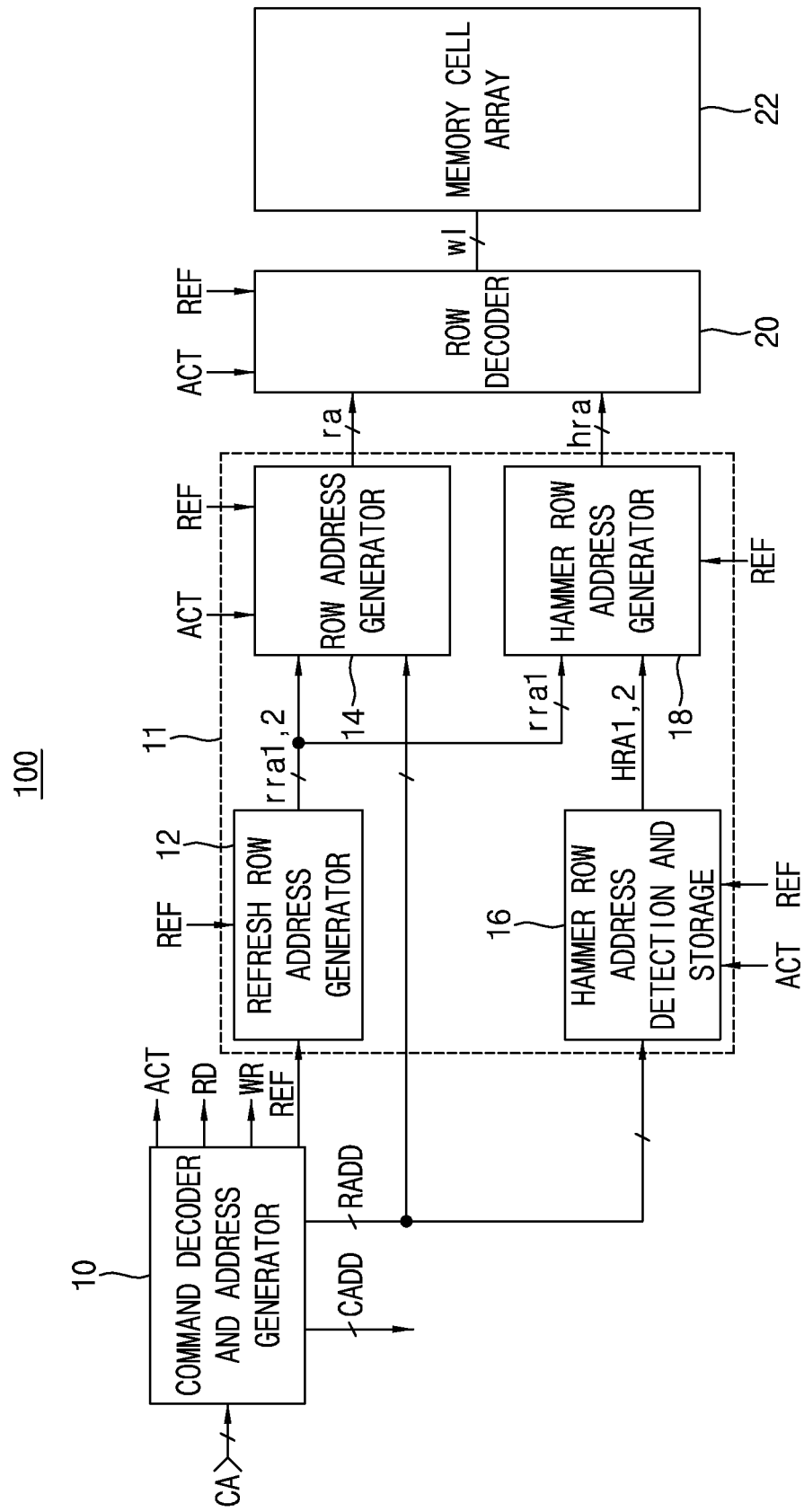
FIG. 1 is a block diagram illustrating a configuration of a semiconductor memory device according to an example embodiment of the inventive concept.

FIG. 1 is a block diagram illustrating a configuration of a semiconductor memory device according to an example embodiment of the inventive concept. A semiconductor memory device 100 may include a command decoder and address generator 10, a refresh row address generator 12, a row address generator 14, a hammer row address detection and storage 16, a hammer row address generator 18, a row decoder 20, and a memory cell array 22.

Each of the blocks shown in FIG. 1 will be described below.

The command decoder and address generator 10 may decode a command signal included in a command and address CA to generate an active command ACT, a read command RD, a write command WR, and a refresh command REF, and receive an address signal included in the command and address CA to generate a row address RADD and a column address CADD. The row address RADD may be generated together with the active command ACT, and the column address CADD may be generated together with the read command RD or the write command WR. The refresh command REF may be a self refresh command or an auto refresh command. When the refresh command REF is the self refresh command, the refresh command REF may be internally generated, and when the refresh command REF is the auto refresh command, the refresh command REF may be applied from an external controller (not shown).

The refresh row address generator 12 may generate a first refresh row address rra1 and a second refresh row address rra2 in response to the refresh command REF. The first refresh row address rra1 may be used to select a plurality of word lines of a memory cell array block of the memory cell array 22, and the second refresh row address rra2 may be used to select a plurality of memory cell array blocks of the memory cell array 22.

The row address generator 14 receives the row address RADD, the active command ACT, and the refresh command REF from the command decoder and address generator 10, and may select the row address RADD in response to the active command ACT, and select the first refresh row address rra1 and the second refresh row address rra2 in response to the refresh command REF to generate a row address signal ra.

The hammer row address detection and storage 16 may receive the row address RADD in response to the active command ACT, detect a hammer aggressive row address, and store at least one hammer victim row address adjacent to the hammer aggressive row address as a hammer row address. The hammer row address detection and storage 16 may output a first hammer row address HRA1 and a second hammer row address HRA2 in response to the refresh command REF. The first hammer row address HRA1 may be used to select a plurality of word lines of the memory cell array block of the memory cell array 22, and the second hammer row address HRA2 may be used to select a plurality of memory cell array blocks of the memory cell array 22. When an identical row address RADD is received a threshold number of times or more in response to the active command ACT, the hammer row address detection and storage 16 may detect the identical row address RADD as the hammer aggressive row address. The threshold number of times may be predetermined. In other words, the hammer row address detection and storage 16 may detect the hammer aggressive row address based on the frequency of receiving an identical row address. The hammer row address detection and storage 16 may detect the hammer row address in various manners.

When each of the second refresh row address rra2 and an adjacent second refresh row address, which is adjacent to the second refresh row address rra2 and is used to select at least one memory cell array block adjacent to the memory cell array block selected by the second refresh row address rra2, and the second hammer row address HRA2, are compared and do not match; in response to the refresh command REF, the hammer row address generator 18 may generate the first hammer row address HRA1 and the second hammer row address HRA2 as a hammer row address signal hra.

The row decoder 20 may receive the active command ACT, the refresh command REF, the row address signal ra, and the hammer row address signal hra, and may decode the row address signal ra in response to the active command ACT to generate word line signals wl, and decode at least one of the row address signal ra and the hammer row address signal hra in response to the refresh command REF to generate the word line signals wl. The row decoder 20 may select one among the plurality of word lines of the memory cell array block corresponding to the row address signal ra in response to the refresh command REF, and select one among the plurality of word lines of the memory cell array block corresponding to the hammer row address signal hra.

The memory cell array 22 may include a plurality of memory cell array blocks including a plurality of dynamic memory cells connected between the plurality of word lines selected in response to the word line signals wl and a plurality of bit lines. When a word line of at least one memory cell array block corresponding to the row address signal ra is selected, the memory cell array 22 may perform a normal refresh operation of reading data of the plurality of dynamic memory cells connected to the selected word line to the bit lines, amplifying the data, and rewriting the amplified data. Further, when a word line of at least one memory cell array block corresponding to the hammer row address signal hra is selected, the memory cell array 22 may perform a hammer refresh operation of reading data of the plurality of dynamic memory cells connected to the selected word line to the bit lines, amplifying the data, and rewriting the amplified data.

In FIG. 1, the refresh row address generator 12, the row address generator 14, the hammer row address detection and storage 16, and the hammer row address generator 18 may configure a refresh controller 11. The refresh controller 11 may control the memory cell array 22 to perform the hammer refresh operation on at least one third memory cell array block except at least one first memory cell array block among the plurality of memory cell array blocks and at least one second memory cell array block adjacent to the at least one first memory cell array block while performing the normal refresh operation on the at least one first memory cell array block.

Figure 2:
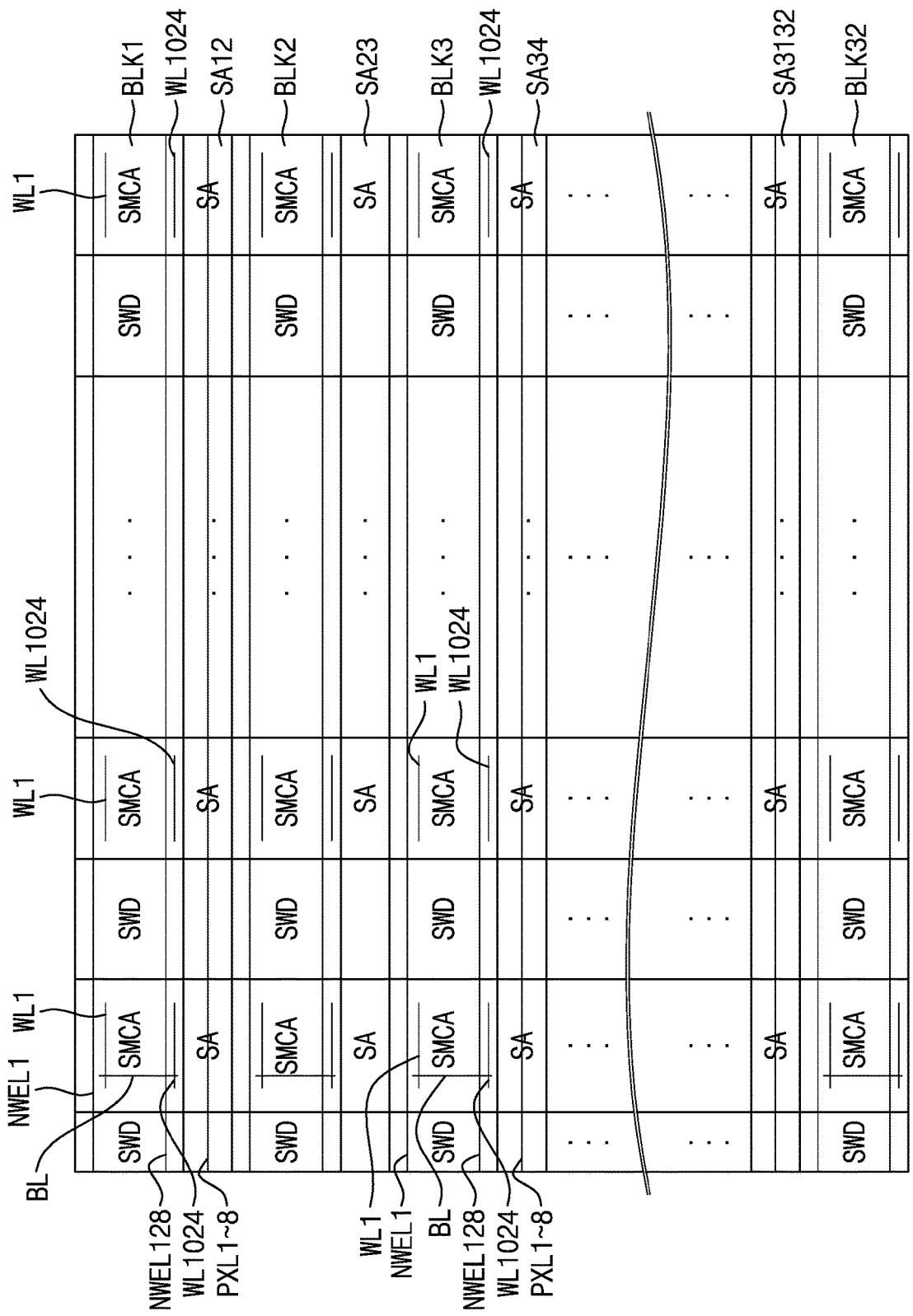
FIG. 2 is a schematic diagram illustrating a memory cell array according to an example embodiment of the inventive concept.

FIG. 2 is a schematic diagram illustrating the memory cell array 22 according to an example embodiment of the inventive concept.

The memory cell array 22 will be described below with reference to FIG. 2.

The memory cell array 22 may include 32 memory cell array blocks BLK1 to BLK32 and 30 sense amplification blocks SA12 to SA3132. Each of the 32 memory cell array blocks BLK1 to BLK32 may include a plurality of sub memory cell array blocks SMCA and a plurality of sub word line drivers SWD, and each of the 30 sense amplification blocks SA12 to SA3132 may include a plurality of sub sense amplification blocks SA. 128 main word lines NWEL1 to NWEL128 and 1024 word lines WL1 to WL1024 may be arranged in each of the 32 memory cell array blocks BLK1 to BLK32. Each of the 32 memory cell array blocks BLK1 to BLK32 may include a plurality of dynamic memory cells connected between the 1024 word lines WL1 to WL1024 and the plurality of bit lines. Each of the 30 sense amplification blocks SA12 to SA3132 may be disposed between adjacent memory cell array blocks. Eight word line selection signal lines PXL1 to PXL8 may be arranged in each of the 30 sense amplification blocks SA12 to SA3132.

The sub word line driver SWD arranged in a left side of each of the sub memory cell array blocks SMCA may select one among the word lines WL1 to WL1024 when one among the main word lines NWEL1 to NWEL128 and one among the word line selection signal lines PXL1 to PXL8 are selected. For example, when the main word line NWEL1 of each of the memory cell array blocks BLK1 to BLK32 is selected and the word line selection signal line PXL8 of each of the sense amplification blocks SA12 to SA3132 is selected, the sub word line drivers SWD for each of the memory cell array blocks BLK1 to BLK32 may select the word lines WL1 of the sub memory cell array blocks SMCA of each of the memory cell array blocks BLK1 to BLK32. When the main word line NWEL128 of each of the memory cell array blocks BLK1 to BLK32 is selected and the word line selection signal line PXL8 of each of the sense amplification blocks SA12 to SA3132 is selected, the sub word line drivers SWD for each of the memory cell array blocks BLK1 to BLK32 may select the word lines WL1024 of the sub memory cell array blocks SMCA of each of the memory cell array blocks BLK1 to BLK32. That is, the word lines WL1 to WL1024 of the sub memory cell array blocks SMCA of each of the memory cell array blocks BLK1 to BLK32 may be selected when one of the main word lines NWEL1 to NWEL128 and one of the word line selection signal lines PXL1 to PXL8 are selected.

Each of the 30 sense amplification blocks SA12 to SA3132 may be shared by adjacent memory cell array blocks. Each of the 30 sense amplification blocks SA12 to SA3132 may amplify data read from the plurality of dynamic memory cells connected to a selected one word line of an adjacent one memory cell array block to the bit lines, and rewrite the amplified data when performing the normal refresh operation or the hammer refresh operation. Each of the 30 sense amplification blocks SA12 to SA3132 may be shared by two adjacent memory cell array blocks and may not be simultaneously used for the normal refresh operation and the hammer refresh operation of the two adjacent memory cell array blocks.

Figure 3:
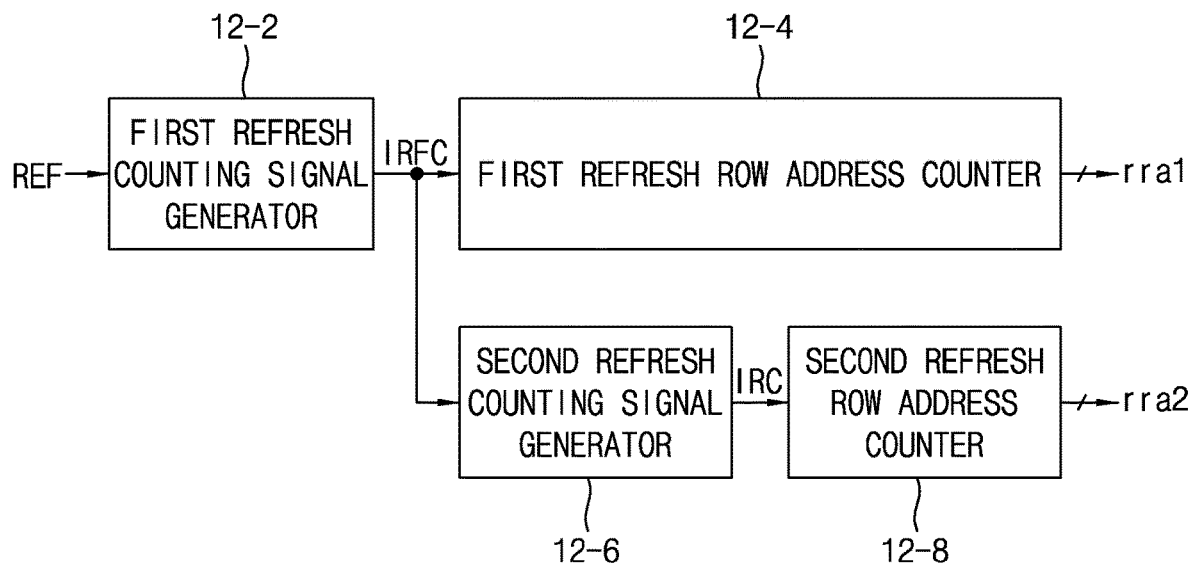
FIG. 3 is a block diagram illustrating a configuration of a refresh row address generator according to an example embodiment of the inventive concept.

FIG. 3 is a block diagram illustrating a configuration of the refresh row address generator 12 according to an example embodiment of the inventive concept. The refresh row address generator 12 may include a first refresh counting signal generator 12-2, a first refresh row address counter 12-4, a second refresh counting signal generator 12-6, and a second refresh row address counter 12-8.

Each of the blocks shown in FIG. 3 will be described below.

The first refresh counting signal generator 12-2 may generate a first refresh counting signal IRFC in response to the refresh command REF. The refresh command REF may be generated every refresh period. The refresh period may be smaller than a refresh retention time in which the dynamic memory cell may maintain data without performing the normal refresh operation. The first refresh counting signal IRFC may be a signal activated during a refresh time tRFC within a refresh interval time tREFi. (See FIG. 9)

The first refresh row address counter 12-4 may perform a counting operation in response to the first refresh counting signal IRFC, and generate the first refresh row address rra1. For example, the first row address counter 12-4 may perform an up counting operation increasing by one, and generate a 10-bit first refresh row address rra1 in a range of "0000000000" to "1111111111".

The second refresh counting signal generator 12-6 may generate a second refresh counting signal IRC in response to the first refresh counting signal IRFC. For example, the second refresh counting signal generator 12-6 may generate a second refresh counting signal IRC activated by a threshold number of times during the refresh time tRFC. The threshold number of times may be predetermined.

The second refresh row address counter 12-8 may perform a counting operation in response to the second refresh counting signal IRC, and generate the second refresh row address rra2. For example, the second refresh row address counter 12-8 may perform an up counting operation increasing by one, and generate a 5-bit second refresh row address rra2 in a range of "00000" to "11111".

Figure 4:
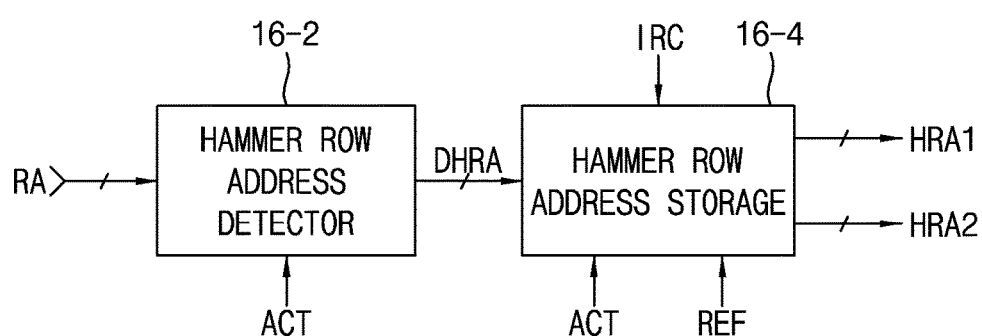
FIG. 4 is a block diagram illustrating a configuration of a hammer row address detection and storage according to an example embodiment of the inventive concept.

FIG. 4 is a block diagram illustrating a configuration of the hammer row address detection and storage 16 according to an example embodiment of the inventive concept. The hammer row address detection and storage 16 may include a hammer row address detector 16-2 and a hammer row address storage 16-4.

Each of the blocks shown in FIG. 4 will be described below.

When an identical row address RADD is applied a threshold number of times or more in response to the active command ACT, the hammer row address detector 16-2 may determine the identical row address RADD to be a hammer aggressive row address, and detect at least one row address adjacent to the hammer aggressive row address to be a hammer victim row address DHRA. The threshold number of times may be predetermined.

The hammer row address storage 16-4 may store the hammer victim row address DHRA in response to the active command ACT, and output the hammer victim row address DHRA as the first hammer row address HRA1 and the second hammer row address HRA2 in response to the refresh command REF and the second refresh counting signal IRC.

Figure 5:
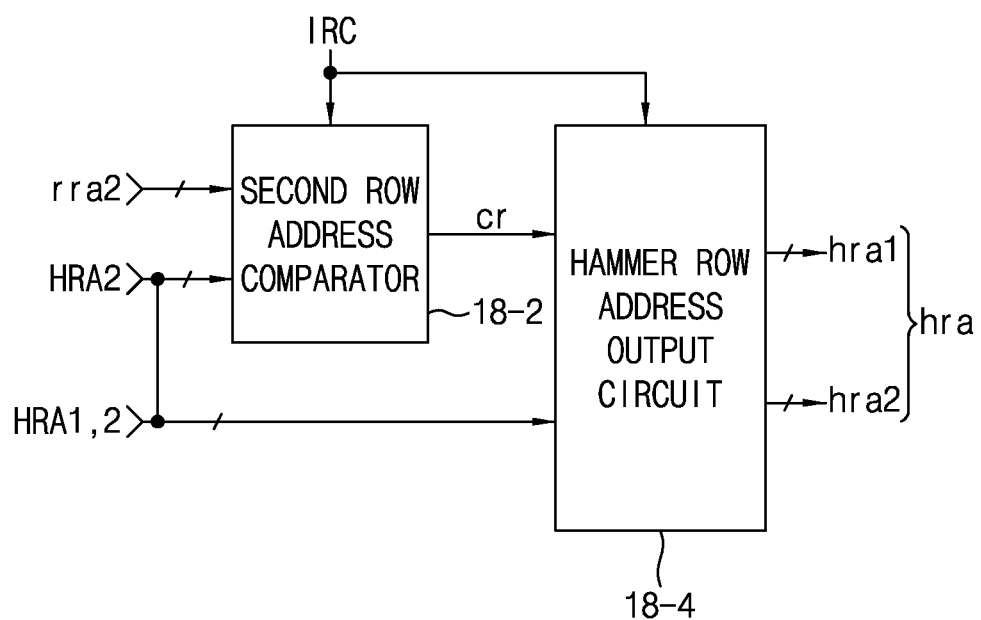
FIG. 5 is a block diagram illustrating a configuration of a hammer row address generator according to an example embodiment of the inventive concept.

FIG. 5 is a block diagram illustrating a configuration of the hammer row address generator 18 according to an example embodiment of the inventive concept. The hammer row address generator 18 may include a second row address comparator 18-2, and a hammer row address output circuit 18-4.

Each of the blocks shown in FIG. 5 will be described below.

The second row address comparator 18-2 may input the second refresh row address rra2 and the second hammer row address HRA2 in response to the second refresh counting signal IRC, perform a comparison operation of comparing the second hammer row address HRA2 with each of the second refresh row address rra2 and at least one adjacent second refresh row address that is adjacent to the second refresh row address rra2, and generate a comparison result signal cr. The second row address comparator 18-2 may perform the comparison operation by excluding some bits of the second refresh row address rra2 and some bits of the second hammer row address HRA2. When the second refresh row address rra2 and the second hammer row address HRA2 do not match and the at least one adjacent second refresh row address adjacent to the second refresh row address rra2 and the second hammer row address HRA2 do not match, the second row address comparator 18-2 may activate the comparison result signal cr to indicate a mismatch.

When the comparison result signal cr indicates a mismatch, the hammer row address output circuit 18-4 may output the first hammer row address HRA1 and the second hammer row address HRA2 as a first hammer row address signal hra1 and a second hammer row address signal hra2 in response to the second refresh counting signal IRC. For example, when the comparison result signal cr is activated, the hammer row address output circuit 18-4 may output the first hammer row address signal hra1 and the second hammer row address signal hra2, and when the comparison result signal cr is deactivated, the hammer row address output circuit 18-4 may not output the first hammer row address signal hra1 and the second hammer row address signal hra2.

Figure 6:
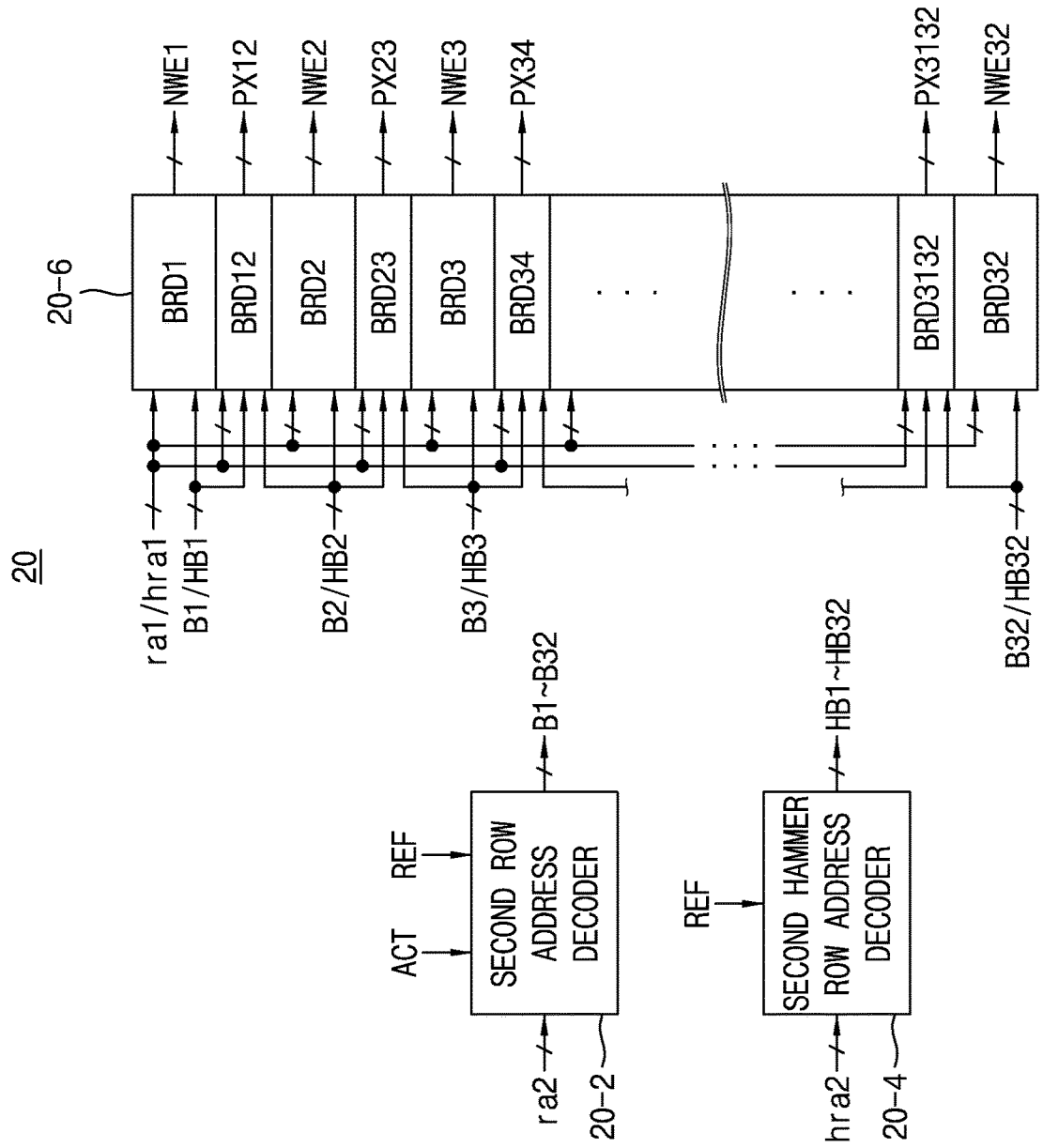
FIG. 6 is a block diagram illustrating a configuration of a row decoder according to an example embodiment of the inventive concept.

FIG. 6 is a block diagram illustrating a configuration of the row decoder 20 according to an example embodiment of the inventive concept. The row decoder 20 may include a second row address decoder 20-2, a second hammer row address decoder 20-4, and a first row address decoder 20-6. The first row address decoder 20-6 may include first block row decoders BRD1 to BRD32 and second block row decoders BRD12 to BRD3132.

The row decoder 20 shown in FIG. 6 illustrates an example in which the memory cell array 22 includes a total of 32 memory cell array blocks, 4 memory cell array blocks are simultaneously selected, and a normal refresh operation is simultaneously performed on a plurality of dynamic memory cells connected to one word line of each of the 4 memory cell array blocks.

Each of the blocks shown in FIG. 6 will be described below.

The second row address decoder 20-2 may decode a 5-bit second row address signal ra2 in response to the active command ACT or the refresh command REF, and generate block selection signals B1 to B32. The second row address decoder 20-2 may activate one among the block selection signals B1 to B32 in response to the active command ACT, or simultaneously activate 4 block selection signals B1, B9, B17, and B25; B2, B10, B18, and B26; B3, B11, B19, and B27; B4, B12, B20, and B28; B5, B13, B21, and B29; B6, B14, B22, and B30; B7, B15, B23, and B31; or B8, B16, B24, and B32 in response to the refresh command REF. For example, the second row address decoder 20-2 may decode a lower 3-bits excluding an upper 2-bits of a 5-bit second row address signal ra2 in response to the refresh command REF, and simultaneously activate the 4 block selection signals.

The second hammer row address decoder 20-4 may decode a 5-bit second hammer row address signal hra2, and generate hammer block selection signals HB1 to HB32. The second hammer row address decoder 20-4 may activate one among the hammer block selection signals HB1 to HB32 in response to the refresh command REF.

Each of the first block row decoders BRD1 to BRD32 may decode an x-bit of a first row address signal ra1 in response to the corresponding block selection signal B1, B2, . . . , or B32 or an x-bit of the first hammer row address signal hra1 in response to the corresponding hammer block selection signal HB1, HB2, . . . , or HB32, and generate a corresponding main word line selection signal NWE1, NWE2, . . . , or NWE32. For example, each of the first block row decoders BRD1 to BRD32 may decode an upper 7-bits of a 10-bit first row address signal ra1 or an upper 7-bits of a 10-bit first hammer row address signal hra1, and generate the corresponding main word line selection signal NWE1, NWE2, . . . , or NWE32. The number of signals of each of the main word line selection signals NWE1 to NWE32 may be 128.

Each of the second block row decoders BRD12 to BRD3132 may decode y-bits of the first row address signal ra1 in response to the corresponding block selection signal B1, B2, . . . , or B32 or y-bits of the first hammer row address signal hra1 in response to the corresponding hammer block selection signal HB1, HB2, . . . , or HB32, and generate a corresponding word line selection signal PX12, PX23, . . . , or PX3132. For example, each of the second block row decoders BRD12 to BRD3132 may decode a lower 3-bits of the 10-bit first row address signal ra1 or a lower 3-bits of the 10-bit first hammer row address signal hra1, and generate the corresponding word line selection signal PX12, PX23, . . . , or PX3132. The number of signals of each of the word line selection signals PX12 to PX3132 may be 8.

The word lines WL1 to WL1024 of each of the memory cell array blocks BLK1 to BLK32 shown in FIG. 2 may be selected by combining the 128 corresponding main word line selection signal NWE1, NWE2, . . . , or NWE32 and the 8 corresponding word line selection signal PX12, PX23, . . . , or PX3132.

FIGS. 7 and 8 are diagrams for describing memory cell array blocks capable of performing a hammer refresh operation when a normal refresh operation is performed on each of the memory cell array blocks BLK1 to BLK32 of the memory cell array 22 according to an example embodiment of the inventive concept.

In FIGS. 7 and 8, blocks slashed in a left direction represent memory cell array blocks on which the normal refresh operation is performed, blocks slashed in a right direction represent memory cell array blocks on which the hammer refresh operation may not be performed, and non-slashed blocks represent memory cell array blocks on which the hammer refresh operation may be performed. An example in which the 4 block selection signals B1, B9, B17, and B25; B2, B10, B18, and B26; B3, B11, B19, and B27; B4, B12, B20, and B28; B5, B13, B21, and B29; B6, B14, B22, and B30; B7, B15, B23, and B31; or B8, B16, B24, and B32 are simultaneously activated and then the normal refresh operation is performed on the plurality of dynamic memory cells connected to one word line of each of the four memory cell array blocks BLK1, BLK9, BLK17, and BLK25; BLK2, BLK10, BLK18, and BLK26; BLK3, BLK11, BLK19, and BLK27; BLK4, BLK12, BLK20, and BLK28; BLK5, BLK13, BLK21, and BLK29; BLK6, BLK14, BLK22, and BLK20; BLK7, BLK15, BLK23, and BLK31; or BLK8, BLK16, BLK24, and BLK32 is illustrated.

Referring to (a) of FIG. 7, when the 4 block selection signals B1, B9, B17, and B25 are simultaneously activated and the normal refresh operation is performed on the plurality of dynamic memory cells connected to one word line of each of the four memory cell array blocks BLK1, BLK9, BLK17, and BLK25, the hammer refresh operation may be performed when there are a plurality of dynamic memory cells corresponding to the hammer row address signal hra in at least one of the memory cell array blocks BLK3 to BLK7, BLK11 to BLK15, BLK19 to BLK23, and BLK27 to BLK32 excluding the 4 memory cell array blocks BLK1, BLK9, BLK17, and BLK25 and the memory cell array blocks BLK2, BLK8, BLK10, BLK16, BLK18, BLK24, and BLK26 adjacent to the 4 memory cell array blocks BLK1, BLK9, BLK17, and BLK25. For example, when the hammer block selection signal HB5 is activated, the hammer refresh operation may be performed on the plurality of dynamic memory cells connected to a word line corresponding to the hammer row address signal hra of the memory cell array block BLK5. The normal refresh operation and the hammer refresh operation may be simultaneously performed. On the other hand, the hammer refresh operation may not be performed when there are the plurality of dynamic memory cells corresponding to the hammer row address signal hra in at least one (for example, the memory cell array block BLK8) of the 4 memory cell array blocks BLK1, BLK9, BLK17, and BLK25 and the memory cell array blocks BLK2, BLK8, BLK10, BLK16, BLK18, BLK24, and BLK26 adjacent to the 4 memory cell array blocks BLK1, BLK9, BLK17, and BLK25.

Referring to (b) of FIG. 7, when the 4 block selection signals B2, B10, B18, and B26 are simultaneously activated and the normal refresh operation is performed on the plurality of dynamic memory cells connected to one word line of each of the 4 memory cell array blocks BLK2, BLK10, BLK18, and BLK26, the hammer refresh operation may be performed when there are the plurality of dynamic memory cells corresponding to the hammer row address signal hra in at least one of the memory cell array blocks BLK4 to BLK8, BLK12 to BLK16, BLK20 to BLK24, and BLK28 to BLK32 excluding the 4 memory cell array blocks BLK2, BLK10, BLK18, and BLK26 and the memory cell array blocks BLK1, BLK3, BLK9, BLK11, BLK17, BLK19, BLK25, and BLK27 adjacent to the 4 memory cell array blocks BLK2, BLK10, BLK18, and BLK26. For example, when the hammer block selection signal HB13 is activated, the hammer refresh operation may be performed on the plurality of dynamic memory cells connected to a word line corresponding to the hammer row address signal hra of the memory cell array block BLK13. Further, the hammer refresh operation may be performed on the plurality of dynamic memory cells connected to a word line corresponding to the hammer row address signal hra of the memory cell array block BLK8 in which the hammer refresh operation may not be performed in the description of FIG. 7A.

Referring to (c) of FIG. 7, when the 4 block selection signals B3, B11, B19, and B27 are simultaneously activated and the normal refresh operation is performed on the plurality of dynamic memory cells connected to one word line of each of the 4 memory cell array blocks BLK3, BLK11, BLK19, and BLK27, the hammer refresh operation may be performed when there are the plurality of dynamic memory cells corresponding to the hammer row address signal hra in at least one of the memory cell array blocks BLK5 to BLK9, BLK13 to BLK17, BLK21 to BLK25, and BLK29 to BLK32 excluding the 4 memory cell array blocks BLK3, BLK11, BLK19, and BLK27 and the memory cell array blocks BLK2, BLK4, BLK10, BLK12, BLK18, BLK20, BLK26, and BLK28 adjacent to the 4 memory cell array blocks BLK3, BLK11, BLK19, and BLK27. For example, when the hammer block selection signal HB22 is activated, the hammer refresh operation may be performed on the plurality of dynamic memory cells connected to a word line corresponding to the hammer row address signal hra of the memory cell array block BLK22. The normal refresh operation and the hammer refresh operation may be simultaneously performed.

Since (d) of FIG. 7 and (a) to (d) of FIG. 8 are easily understood with reference to the descriptions of (a) to (c) of FIG. 7, descriptions thereof will be omitted.

Referring to FIGS. 7 and 8, the hammer refresh operation may be performed on memory cell array blocks excluding 4 memory cell array blocks in which the normal refresh operation is performed and memory cell array blocks adjacent to the 4 memory cell array blocks in which the normal refresh operation is performed while the normal refresh operation is performed on the 4 memory cell array blocks.

In FIGS. 2, 7, and 8, positions of the memory cell array blocks BLK1 to BLK32 may be different from the drawings. For example, the memory cell array blocks BLK8, BLK1, BLK5, BLK3, BLK7, BLK2, BLK6, BLK4, BLK16, BLK9, BLK13, BLK11, BLK15, BLK10, BLK14, BLK12, BLK24, BLK17, BLK21, BLK19, BLK23, BLK18, BLK22, BLK20, BLK32, BLK25, BLK29, BLK27, BLK31, BLK26, BLK30, and BLK28 may be arranged in the positions of the memory cell array blocks BLK1 to BLK32.

FIG. 9 is an operational timing diagram for describing an operation of the semiconductor memory device 100 according to an example embodiment of the inventive concept.

Referring to FIGS. 1 to 9, the first refresh counting signal generator 12-2 may generate the first refresh counting signal IRFC in response to the refresh command REF. For example, the first refresh counting signal generator 12-2 may generate the first refresh counting signal IREF which is activated 2048 times during the refresh period. For example, the first refresh counting signal IREF may be activated during the refresh time tRFC in every refresh interval time tREFi. For example, when the refresh command REF is generated every 32 ms, and the refresh interval time tREFi may be 15.6 μs.

The second refresh counting signal generator 12-6 may generate the second refresh counting signal IRC which is activated 4 times during the refresh time tRFC which is an activation period of the first refresh counting signal IREF. The second refresh counting signal generator 12-6 may generate the second refresh counting signal IRC which is activated 8192 times during the refresh period. Whenever the second refresh counting signal IRC is activated, the normal refresh operation may be performed on the plurality of dynamic memory cells connected to the 4 word lines. Accordingly, when the second refresh counting signal IRC is activated 8192 times, the normal refresh operation may be performed on 32768 word lines of the 32 memory cell array blocks BLK1 to BLK32.

The first refresh row address counter 12-4 may perform a counting operation in response to an odd-numbered rising edge of the first refresh counting signal IRFC, and generate a 10-bit first refresh row address rra1. For example, the first refresh row address counter 12-4 may generate the first refresh row address rra1 increasing by one from "0000000000" to "1111111111".

The second refresh row address counter 12-8 may perform a counting operation in response to a rising edge of the second refresh counting signal IRC, and generate a 5-bit second refresh row address rra2. For example, the second refresh row address counter 12-8 may generate the second refresh row address rra2 increasing by one from "00000" to "00111".

First, an operation of an example in which the first refresh row address rra1 which is "0000000000" is generated from the first refresh row address counter 12-4, the second refresh row address rra2 which is "00000" is generated from the second refresh row address counter 12-8, and the first and second hammer row addresses HRA1 and HRA2 which are "001000000000010" and "001110000000000" are stored in the hammer row address storage 16-4 will be described below.

Since each of "000" which is a lower 3-bits of the second refresh row address rra2 which is "00000," and "111" and "001" which are lower 3-bits of the adjacent second refresh row addresses adjacent to the second refresh row address rra2, and "100" which is a lower 3-bits of the second hammer row address HRA2 which is "00100," are compared and do not match in response to the second refresh counting signal IRC, the second row address comparator 18-2 may activate the comparison result signal cr. Further, since each of "000" which is the lower 3-bits of the second refresh row address rra2 which is "00000," and "111" and "001" which are the lower 3-bits of the adjacent second refresh row addresses adjacent to the second refresh row address rra2, and "111" which is a lower 3-bits of the second hammer row address HRA2 which is "00111," are compared and do match in response to the second refresh counting signal IRC, the second row address comparator 18-2 may deactivate the comparison result signal cr.

When the comparison result signal cr is activated, the hammer row address output circuit 18-4 may output the first hammer row address HRA1 which is "0000000010" and the second hammer row address HRA2 which is "00100" as the first hammer row address signal hra1 and the second hammer row address signal hra2, respectively.

The second row address decoder 20-2 may decode the lower 3-bits of the second row address signal ra2 which is "000," and simultaneously activate the block selection signals B1, B9, B17, and B25.

The second hammer row address decoder 20-4 may decode the second hammer row address signal hra2 which is "00100," and activate the hammer block selection signal HB5.

When the block selection signals B1, B9, B17, and B25 are simultaneously activated, the first block row decoders BRD1, BRD9, BRD17, and BRD25 may decode "0000000" corresponding to the upper 7-bits of the 10-bit first refresh row address rra1, and individually activate one of the main word line selection signals NWE1, NWE9, NWE17, and NWE25. The second block row decoders BRD12, BRD910, BRD1718, and BRD2526 may decode "010" corresponding to the remaining 3-bits of the 10-bit first refresh row address rra1, and individually activate one of the word line selection signals PX12, PX910, PX1718, and PX2526. That is, the first block row decoders BRD1, BRD9, BRD17, and BRD25 may select the main word lines NWEL1 of the memory cell array blocks BLK1, BLK9, BLK17, and BLK25 when the upper 3-bits of the first row address signal ra1 is "0000000," and the second block row decoders BRD12, BRD910, BRD1718, and BRD2526 may select the word line selection signal lines PXL1 of the sense amplification blocks SA12, SA910, SA1718, and SA2526 when the lower 3-bits of the first row address signal ra1 is "000". Accordingly, the word line WL1 of each of the memory cell array blocks BLK1, BLK9, BLK17, and BLK25 may be selected.

In this case, when the hammer block selection signal HB5 is activated, the first block row decoder BRD5 may decode "0000000" corresponding to the upper 7-bits of the 10-bit first hammer row address signal hra1, and activate one included in the main word line selection signal NWE5. The second block row decoder BRD56 may decode "010" corresponding to the lower 3-bits of the 10-bit first hammer row address signal hra1, and activate one included in the word line selection signal PX56. That is, the first block row decoder BRD5 may select the main word line NWEL1 when the upper 7-bits of the first hammer row address signal hra1 is "0000000," and the second block row decoder BRD56 may select the word line selection signal line PXL3 when the lower 3-bits of the first hammer row address signal hra1 is "010". Accordingly, the word line WL3 of the memory cell array block BLK5 may be selected.

Therefore, the normal refresh operation on the plurality of dynamic memory cells connected to the word line WL1 of each of the memory cell array blocks BLK1, BLK9, BLK17, and BLK25, and the hammer refresh operation on the plurality of dynamic memory cells connected to the word line WL3 of the memory cell array block BLK5 may be simultaneously performed.

As a result, the first and second hammer row addresses HRA1 and HRA2 which are "001000000000010" stored in the hammer row address storage 16-4 shown in FIG. 3 may be excluded in a next hammer refresh operation.

Second, an operation of an example in which the first refresh row address rra1 which is "0000000000" is generated from the first refresh row address counter 12-4, the second refresh row address rra2 which is "00001" is generated from the second refresh row address counter 12-8, and the first and second hammer row addresses HRA1 and HRA2 which are "001110000000000" are stored in the hammer row address storage 16-4 shown in FIG. 3 will be described below.

Since each of "001" which is a lower 3-bits of the second refresh row address rra2 which is "00001" and "000" and "010" which are lower 3-bits of the adjacent second refresh row addresses adjacent to the second refresh row address rra2, and "111" which is a lower 3-bits of the second hammer row address HRA2 which is "00111," are compared and do not match in response to the second refresh counting signal IRC, the second row address comparator 18-2 may activate the comparison result signal cr.

When the comparison result signal cr is activated, the hammer row address output circuit 18-4 may output the first hammer row address HRA1 which is "0000000000" and the second hammer row address HRA2 which is "00111" as the first hammer row address signal hra1 and the second hammer row address signal hra2, in response to the second refresh counting signal IRC.

The second row address decoder 20-2 may decode "001" which is the lower 3-bits of the second row address signal ra2, and simultaneously activate the block selection signals B2, B10, B18, and B26.

The second hammer row address decoder 20-4 may decode "00111" which is the second hammer row address signal hra2, and activate the hammer block selection signal HB8.

When the block selection signals B2, B10, B18, and B26 are simultaneously activated, the first block row decoders BRD2, BRD10, BRD18, and BRD26 may decode "0000000" which is the upper 7-bits of the first row address signal ra1, and individually activate one of the main word line selection signals NWE1, NWE9, NWE17, and NWE25. The second block row decoders BRD12, BRD910, BRD1718, and BRD2526 may decode "000" corresponding to the remaining 3-bits of the first row address signal ra1, and individually activate one of the word line selection signals PX12, PX910, PX1718, and PX2526. That is, the first block row decoders BRD2, BRD10, BRD18, and BRD26 may select the main word lines NWEL1 of the memory cell array blocks BLK2, BLK10, BLK18, and BLK26 respectively when the upper 7-bits of the first row address signal ra1 is "0000000," and the second block row decoders BRD12, BRD910, BRD1718, and BRD2526 may select the word line selection signal lines PXL1 of the sense amplification blocks SA12, SA910, SA1718, and SA2526 respectively when the lower 3-bits of the first row address signal ra1 is "000". Accordingly, the word line WL1 of each of the memory cell array blocks BLK2, BLK10, BLK18, and BLK26 may be selected.

In this case, when the hammer block selection signal HB8 is activated, the first block row decoder BRD8 may decode "0000000" corresponding to the upper 7-bits of the 10-bit first hammer row address signal hra1, and activate one of the main word lines NWEL1 to NWEL128 of the memory cell array block BLK8. The second block row decoder BRD89 may decode "000" corresponding to the remaining 3-bits of the first hammer row address signal hra1, and activate one of the word line selection signal lines PXL1 to PXL8 of the sense amplification block SA89. That is, the first block row decoder BRD8 may select the main word line NWEL1 of the memory cell array block BLK8 when the upper 7-bits of the first hammer row address signal hra1 is "0000000," and the second block row decoder BRD89 may select the word line selection signal line PXL1 of the sense amplification block SA89 when the lower 3-bits of the first hammer row address signal hra1 is "000". Accordingly, the word line WL1 of the memory cell array block BLK8 may be selected.

Accordingly, the normal refresh operation on the plurality of dynamic memory cells connected to the word line WL1 of each of the memory cell array blocks BLK2, BLK10, BLK18, and BLK26, and the hammer refresh operation on the plurality of dynamic memory cells connected to the word line WL1 of the memory cell array block BLK8 may be simultaneously performed.

Then, whenever the second refresh counting signal IRC is activated, the normal refresh operation and the hammer refresh operation may be simultaneously performed.

Figure 10:
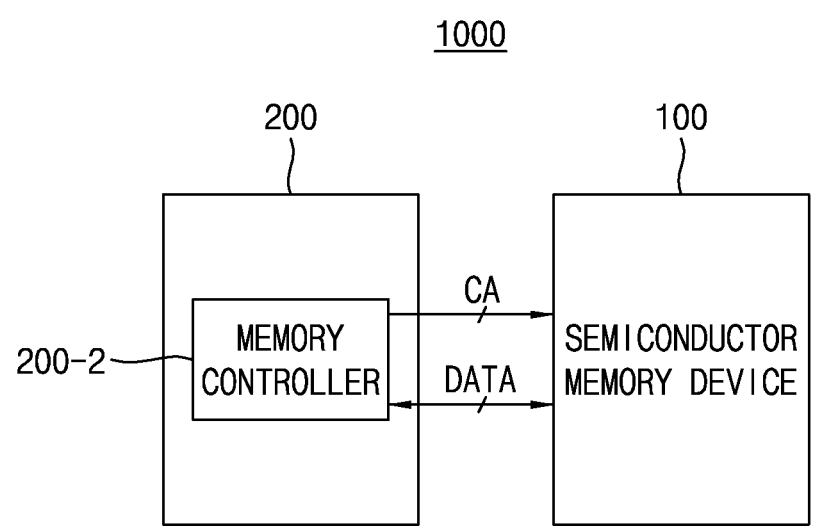
FIG. 10 is a block diagram illustrating a memory system according to an example embodiment of the inventive concept.

FIG. 10 is a block diagram illustrating a memory system according to an example embodiment of the inventive concept. The memory system 1000 may include a control unit 200, and a semiconductor memory device 100. The control unit 200 may include a memory controller 200-2. The control unit 200 may be a central processing unit (CPU). The semiconductor memory device 100 may be a memory module on which a plurality of semiconductor memory devices are installed.

The semiconductor memory device 100 shown in FIG. 10 may have the configuration and perform the operation as described above with reference to FIGS. 1 to 9. That is, the control unit 200 may not need to apply a command related to the hammer refresh operation, and the semiconductor memory device 100 may simultaneously perform the hammer refresh operation while performing the normal refresh operation.

In the example embodiments described above, the term "adjacent" may mean "physically adjacent". That is, an adjacent row address adjacent to a row address may mean a row address selecting a word line physically adjacent to a word line selected by the row address, an adjacent memory cell array block adjacent to a memory cell array block may mean a memory cell array block physically adjacent to the memory cell array block, and an adjacent block selection signal adjacent to a block selection signal may mean a block selection signal selecting a memory cell array block physically adjacent to a memory cell array block selected by the block selection signal.

According to the example embodiments of the inventive concept, the semiconductor memory device may perform a hammer refresh operation while performing a normal refresh operation.

Accordingly, the control unit may not need to apply an extra command or allot extra time in order to perform the hammer refresh operation.

While various example embodiments of the inventive concept have been described with reference to the accompanying drawings, it should be understood by those skilled in the art that various modifications may be made without departing from the scope of the inventive concept and without changing essential features thereof. Therefore, the above-described example embodiments should be considered in a descriptive sense only and not for purposes of limitation.

What is claimed is:
1. A semiconductor memory device comprising:
a memory cell array comprising a plurality of memory cell array blocks; and
a refresh controller configured to control the plurality of memory cell array blocks to perform a normal refresh operation and a hammer refresh operation,
wherein the refresh controller controls the plurality of memory cell array blocks to perform the hammer refresh operation on at least one third memory cell array block in response to a second block address for selecting the at least one third memory cell array block excluding a first memory cell array block and at least one second memory cell array block adjacent to the first memory cell array block when the second block address and a first block address for selecting the first memory cell array block do not match while the normal refresh operation is performed on the first memory cell array block among the plurality of memory cell array blocks in response to the first block address.

2. The semiconductor memory device of claim 1, further comprising a plurality of sense amplification blocks between the plurality of memory cell array blocks,
wherein each of the plurality of memory cell array blocks comprises a plurality of dynamic memory cells connected between a plurality of word lines and a plurality of bit lines,
a plurality of main word lines are arranged in each of the plurality of memory cell array blocks, and
a plurality of word line selection signal lines are arranged in each of the plurality of sense amplification blocks.

3. The semiconductor memory device of claim 2, wherein the refresh controller comprises:
a refresh row address generator configured to generate a first refresh row address and a second refresh row address corresponding to the first block address in response to a refresh command;
a row address generator configured to select a row address in response to an active command, and select the first refresh row address and the second refresh row address in response to the refresh command to generate a row address signal;
a hammer row address generator configured to generate a first hammer row address and a second hammer row address corresponding to the second block address as a hammer row address signal when the second hammer row address is compared with each of the second refresh row address and at least one adjacent second refresh row address adjacent to the second refresh row address, and do not match; and
a row decoder configured to decode the row address signal and the hammer row address signal and generate a plurality of main word line selection signals and a plurality of word line selection signals.

4. The semiconductor memory device of claim 3, wherein the refresh row address generator comprises:
a first refresh counting signal generator configured to generate a first refresh counting signal in response to the refresh command;
a first refresh row address counter configured to perform a counting operation in response to the first refresh counting signal and generate the first refresh row address;
a second refresh counting signal generator configured to generate a second refresh counting signal in response to the first refresh counting signal; and
a second refresh row address counter configured to generate the second refresh row address in response to the second refresh counting signal.

5. The semiconductor memory device of claim 4, wherein the refresh controller comprises a hammer row address detection and storage configured to receive the row address in response to the active command, detect a hammer aggressive row address, and store at least one hammer victim row address that is adjacent to the hammer aggressive row address as a hammer row address.

6. The semiconductor memory device of claim 5, wherein the hammer row address detection and storage comprises:
a hammer row address detector configured to determine an identical row address to be the hammer aggressive row address when the identical row address is applied a threshold number of times or more, and detect at least one row address adjacent to the hammer aggressive row address as the at least one hammer victim row address, in response to the active command; and
a hammer row address output circuit configured to store the at least one hammer victim row address as the hammer row address in response to the active command, and output the at least one hammer victim row address as the first hammer row address and the second hammer row address in response to the refresh command and the second refresh counting signal.

7. The semiconductor memory device of claim 4, wherein the hammer row address generator comprises:
a second row address comparator configured to compare the second hammer row address with each of the second refresh row address and at least one adjacent second refresh row address that is adjacent to the second refresh row address to generate a comparison result signal, in response to the second refresh counting signal; and
a hammer row address output circuit configured to output the first hammer row address and the second hammer row address as a first hammer row address signal and a second hammer row address signal, respectively, in response to the comparison result signal and the second refresh counting signal.

8. The semiconductor memory device of claim 7, wherein the second row address comparator compares first bits excluding a portion of bits of the second hammer row address with second bits excluding a portion of bits of each of the second refresh row address and the at least one adjacent second refresh row address.

9. The semiconductor memory device of claim 7, wherein the row decoder comprises:
a second row address decoder configured to decode a second row address signal included in the row address signal to generate a plurality of block selection signals for selecting the plurality of memory cell array blocks;
a second hammer row address decoder configured to decode the second hammer row address signal to generate a plurality of hammer block selection signals for selecting the plurality of memory cell array blocks;
a plurality of first block row decoders configured to decode a portion of bits of a first row address signal included in the row address signal in response to a corresponding block selection signal among the plurality of block selection signals or a portion of bits of the first hammer row address signal in response to a corresponding hammer block selection signal among the plurality of hammer block selection signals, and generate the plurality of main word line selection signals selecting the plurality of main word lines; and
a plurality of second block row decoders configured to decode remaining bits of the first row address signal in response to at least one adjacent block selection signal among the plurality of block selection signals or remaining bits of the first hammer row address signal in response to at least one adjacent hammer block selection signal among the plurality of hammer block selection signals, and generate the plurality of word line selection signals selecting the plurality of word line selection signal lines.

10. The semiconductor memory device of claim 9, wherein the second row address decoder decodes the second row address signal to select one among the plurality of block selection signals in response to the active command, and decodes the remaining bits excluding a portion of bits of the second row address signal to select a threshold number of the plurality of block selection signals in response to the refresh command.

11. A semiconductor memory device comprising:
a memory cell array comprising a plurality of memory cell array blocks, each of which comprises a plurality of dynamic memory cells connected between a plurality of word lines and a plurality of bit lines and in which a plurality of main word lines are arranged, and a plurality of sense amplification blocks, arranged between the plurality of memory cell array blocks and in which a plurality of word line selection signal lines are arranged;
a refresh row address generator configured to generate a first refresh row address and a second refresh row address in response to a refresh command;
a row address generator configured to select a row address in response to an active command, and select the first refresh row address and the second refresh row address to generate a row address signal in response to the refresh command;
a hammer row address generator configured to generate a first hammer row address and a second hammer row address as a hammer row address signal when the second hammer row address is compared with each of the second refresh row address and at least one adjacent second refresh row address that is adjacent to the second refresh row address, and do not match; and
a row decoder configured to decode the row address signal and the hammer row address signal to generate a plurality of main word line selection signals for selecting the plurality of main word lines of each of the plurality of memory cell array blocks and a plurality of word line selection signals for selecting the plurality of word line selection signal lines of each of the plurality of sense amplification blocks,
wherein a hammer refresh operation is performed on at least one third memory cell array block excluding a first threshold number of first memory cell array blocks among the plurality of memory cell array blocks and a second threshold number of second memory cell array blocks adjacent to the first threshold number of first memory cell array blocks while a normal refresh operation is performed on the first threshold number of first memory cell array blocks.

12. The semiconductor memory device of claim 11, wherein the plurality of word lines of each of the plurality of memory cell array blocks are selected by combining the plurality of main word line selection signals and the plurality of word line selection signals of each of the plurality of memory cell array blocks.

13. The semiconductor memory device of claim 12, wherein the refresh row address generator comprises:
a first refresh counting signal generator configured to generate a first refresh counting signal in response to the refresh command;
a first refresh row address counter configured to perform a counting operation to generate the first refresh row address in response to the first refresh counting signal;
a second refresh counting signal generator configured to generate a second refresh counting signal in response to the first refresh counting signal; and
a second refresh row address counter configured to generate the second refresh row address in response to the second refresh counting signal.

14. The semiconductor memory device of claim 13, wherein the hammer row address generator comprises a hammer row address detection and storage configured to receive a row address to detect a hammer aggressive row address and store at least one hammer victim row address adjacent to the hammer aggressive row address as a hammer row address, in response to the active command.

15. The semiconductor memory device of claim 13, wherein the hammer row address generator comprises:
a second row address comparator configured to compare the second hammer row address with each of the second refresh row address and at least one adjacent second refresh row address that is adjacent to the second refresh row address to generate a comparison result signal, in response to the second refresh counting signal; and
a hammer row address output circuit configured to output the first hammer row address and the second hammer row address as a first hammer row address signal and a second hammer row address signal, respectively, in response to the comparison result signal and the second refresh counting signal.

16. The semiconductor memory device of claim 15, wherein the row decoder comprises:
a second row address decoder configured to decode a second row address signal included in the row address signal to generate a plurality of block selection signals for selecting the plurality of memory cell array blocks;
a second hammer row address decoder configured to decode the second hammer row address signal to generate a plurality of hammer block selection signals for selecting the plurality of memory cell array blocks;
a plurality of first block row decoders configured to decode a portion of bits of a first row address signal included in the row address signal in response to a corresponding block selection signal among the plurality of block selection signals or a portion of bits of the first hammer row address signal in response to a corresponding hammer block selection signal among the plurality of hammer block selection signals, and generate the plurality of main word line selection signals selecting the plurality of main word lines; and
a plurality of second block row decoders configured to decode remaining bits of the first row address signal in response to at least one adjacent block selection signal among the plurality of block selection signals or remaining bits of the first hammer row address signal in response to at least one adjacent hammer block selection signal among the plurality of hammer block selection signals, and generate the plurality of word line selection signals selecting the plurality of word line selection signal lines.

17. A memory system comprising:
a control unit configured to transmit a command and address, and to input and output data; and
a semiconductor memory device configured to receive the command and address, and to input and output the data,
wherein the semiconductor memory device comprises:
a memory cell array comprising a plurality of memory cell array blocks; and
a refresh controller configured to control the plurality of memory cell array blocks to perform a normal refresh operation and a hammer refresh operation,
wherein the refresh controller controls the plurality of memory cell array blocks to perform the hammer refresh operation on at least one third memory cell array block in response to a second block address for selecting the at least one third memory cell array block excluding a first memory cell array block and at least one second memory cell array block adjacent to the first memory cell array block when the second block address and a first block address for selecting the first memory cell array block do not match while the normal refresh operation is performed on the first memory cell array block among the plurality of memory cell array blocks in response to the first block address.

18. The memory system of claim 17, wherein the semiconductor memory device further comprises a plurality of sense amplification blocks between the plurality of memory cell array blocks, each of the plurality of memory cell array blocks comprises a plurality of dynamic memory cells connected between a plurality of word lines and a plurality of bit lines, a plurality of main word lines are arranged in each of the plurality of memory cell array blocks, and a plurality of word line selection signal lines are arranged in each of the plurality of sense amplification blocks.

19. The memory system of claim 18, wherein the refresh controller comprises:

a refresh row address generator configured to generate a first refresh row address and a second refresh row address corresponding to the first block address in response to a refresh command;

a row address generator configured to select a row address in response to an active command, and select the first refresh row address and the second refresh row address corresponding to the second block address in response to the refresh command, to generate a row address signal;

a hammer row address generator configured to generate a first hammer row address and a second hammer row address as a hammer row address signal when the second hammer row address is compared with each of the second refresh row address and at least one adjacent second refresh row address that is adjacent to the second refresh row address, and do not match; and a row decoder configured to decode the row address signal and the hammer row address signal to generate a plurality of main word line selection signals selecting the plurality of main word lines and a plurality of word line selection signals selecting the plurality of word line selection signal lines.

20. The memory system of claim 19, wherein the hammer row address generator comprises:

a second row address comparator configured to compare the second hammer row address and each of the second refresh row address and the at least one adjacent second refresh row address that is adjacent to the second refresh row address in response to a second refresh counting signal, and generate a comparison result signal; and a hammer row address output circuit configured to output the first hammer row address and the second hammer row address as a first hammer row address signal and a second hammer row address signal, respectively, in response to the comparison result signal and the second refresh counting signal.

* * * * *